United States Patent
Jeong et al.

(10) Patent No.: US 9,583,215 B2
(45) Date of Patent: Feb. 28, 2017

(54) SEMICONDUCTOR MEMORY DEVICE AND TESTING METHOD THEREOF

(71) Applicants: Yonghwan Jeong, Hwaseong-si (KR); Hoiju Chung, Yongin-si (KR)

(72) Inventors: Yonghwan Jeong, Hwaseong-si (KR); Hoiju Chung, Yongin-si (KR)

(73) Assignee: SAMSUNG ELECTRONICS CO., LTD., Gyeonggi-do (KR)

(*) Notice: Subject to any disclaimer, the term of this patent is extended or adjusted under 35 U.S.C. 154(b) by 21 days.

(21) Appl. No.: 14/532,392

(22) Filed: Nov. 4, 2014

(65) Prior Publication Data

US 2015/0162099 A1    Jun. 11, 2015

(30) Foreign Application Priority Data

Dec. 11, 2013  (KR) .................. 10-2013-0153991

(51) Int. Cl.

| | | |
|---|---|---|
| G11C 29/00 | (2006.01) | |
| G11C 29/42 | (2006.01) | |
| G06F 11/10 | (2006.01) | |
| G06F 11/22 | (2006.01) | |
| G11C 11/40 | (2006.01) | |
| G11C 29/04 | (2006.01) | |

(52) U.S. Cl.
CPC .......... *G11C 29/42* (2013.01); *G06F 11/1008* (2013.01); *G06F 11/1048* (2013.01); *G06F 11/2215* (2013.01); *G11C 11/40* (2013.01); *G11C 2029/0411* (2013.01)

(58) Field of Classification Search
CPC ...... G06F 11/10; G06F 11/22; G06F 11/1008; G06F 11/1048; G06F 11/08; G11C 29/02; G11C 29/42; G11C 29/44; G11C 2029/0411

See application file for complete search history.

(56) References Cited

U.S. PATENT DOCUMENTS

| | | | | |
|---|---|---|---|---|
| 6,073,258 | A * | 6/2000 | Wheater ............... | G11C 29/44 714/718 |
| 6,678,860 | B1 | 1/2004 | Lee | |
| 6,957,378 | B2 | 10/2005 | Koga et al. | |
| 7,249,296 | B2 * | 7/2007 | Hirabayashi .......... | G11C 29/42 365/201 |

(Continued)

FOREIGN PATENT DOCUMENTS

| | | |
|---|---|---|
| JP | H11-232896 A | 8/1999 |
| JP | 2007-149222 A | 6/2007 |

(Continued)

*Primary Examiner* — Shelly A Chase
(74) *Attorney, Agent, or Firm* — Harness, Dickey & Pierce, P.L.C.

(57) ABSTRACT

A semiconductor memory device is provided which includes memory cells, a first error correction code (ECC) circuit configured to generate at least one selected parity bit corresponding to a selected data bit using an error correction code during a write operation and to correct an error of the selected data bit using the selected parity bit during a read operation, and a test circuit configured to selectively perform at least one of an error correction operation and a redundancy repair operation on at least one of the selected data bit and the selected parity bit based on test mode register set (TMRS) information.

19 Claims, 13 Drawing Sheets

(56) References Cited

U.S. PATENT DOCUMENTS

| | | | |
|---|---|---|---|
| 7,353,438 B2* | 4/2008 | Leung | G06F 11/1048 |
| | | | 714/720 |
| 7,373,583 B2* | 5/2008 | Hummler | G11C 29/02 |
| | | | 714/763 |
| 8,111,568 B2 | 2/2012 | Park | |
| 8,151,173 B2 | 4/2012 | Hirose et al. | |
| 8,225,171 B2 | 7/2012 | Park | |
| 2002/0184592 A1 | 12/2002 | Koga et al. | |
| 2005/0240838 A1 | 10/2005 | Iwai | |
| 2008/0082870 A1 | 4/2008 | Park | |
| 2008/0091979 A1 | 4/2008 | Okuda | |
| 2008/0294934 A1 | 11/2008 | Park | |
| 2009/0089646 A1 | 4/2009 | Hirose et al. | |

FOREIGN PATENT DOCUMENTS

| | | |
|---|---|---|
| JP | 2007-328894 A | 12/2007 |
| KR | 10-2008-0007806 A | 1/2008 |
| KR | 10-2008-0030270 A | 4/2008 |
| KR | 10-0852191 B1 | 8/2008 |

* cited by examiner

SEMICONDUCTOR MEMORY DEVICE AND TESTING METHOD THEREOF

CROSS-REFERENCE TO RELATED APPLICATIONS

This U.S. non-provisional patent application claims priority under 35 U.S.C. §119 is made to Korean Patent Application No. 10-2013-0153991 filed Dec. 11, 2013, the entire contents of which are hereby incorporated by reference.

BACKGROUND

Defective memory cells occur when a semiconductor memory device is fabricated. A variety of techniques are used to repair the defective memory cells. Two repair techniques are: a redundancy repair technique for replacing defective memory cells by a row or column unit and an error correction code (hereinafter, referred to as "ECC") for correcting errors of defective memory cells. ECC includes an on-chip ECC technique in which errors are corrected within a semiconductor memory device and an off-chip technique in which errors are corrected by an external controller for controlling the semiconductor memory device.

As a semiconductor memory device is scaled down, the number of defective memory cells increases sharply. A great deal of redundancy is required to replace defective memory cells using a conventional redundancy repair technique. This means that the size of a memory chip increases. A row redundancy circuit is formed of a plurality of row cell units (e.g., two or four word lines), or a column redundancy circuit is formed of a plurality of column cell units (e.g., four or eight bit lines). A problem of such redundancy circuits is that a lot of cells are unnecessarily used to repair a 1-bit defect. Also, a redundancy repair technique is not suitable to cope with reliability/quality problems caused after a fabrication process. In recent years, there has been research of on-chip and off-chip ECC techniques.

SUMMARY

At least some example embodiments of inventive concepts herein relate to a semiconductor memory device with an on-chip error correction code (ECC) or an off-chip ECC and a testing method thereof.

At least one example embodiment of inventive concepts discloses a semiconductor memory device including memory cells, a first error correction code (ECC) circuit configured to generate at least one parity bit corresponding to a selected data bit using an error correction code during a write operation and to correct an error of the selected data bit using the at least one parity bit during a read operation, and a test circuit configured to selectively perform at least one of an error correction operation and a redundancy repair operation of the selected data bit or the parity bit based on test mode register set (TMRS) information.

At least one embodiment of inventive concepts discloses a semiconductor memory device including at least one data cell configured to store a selected data bit, at least one parity cell configured to store at least one parity bit, an error detector configured to detect errors based on the selected data bit, a test data bit, the parity bit read and at a test parity bit, an error counter configured to count a number of the errors of the selected data bit or the number of errors of the parity bit based on output values of the error detector, an error corrector configured to correct an error of at least one of the selected data bit and the parity bit if the number of errors is less than a desired value, a comparator configured to determine at least one of the corrected data bit and the corrected parity bit, and an input/output buffer configured to store output values output from the comparator.

At least one example embodiment of inventive concepts discloses a test system including at least one memory chip and a tester configured to test the at least one memory chip, the at least one memory chip including an error correction code (ECC) circuit configured to generate at least one parity bit corresponding to a data bit during a write operation and to correct an error of the data bit using the parity bit during a read operation, and a test circuit configured to selectively perform at least one of an error correction operation and a redundancy repair operation of the data bit or the parity bit if the ECC circuit is inactivated.

At least one example embodiment of inventive concepts discloses a method of testing a semiconductor memory device, the method including reading data from memory cells, detecting at least one error of the read data, determining whether to count a number of errors of the read data, counting an error of the read data based on the determining whether to count the number of errors of the read data, determining whether the number of errors is less than a desired value, correcting the error of the read data if the number of errors is less than the desired value, and outputting the corrected data.

A method of testing a semiconductor memory device with an on-chip ECC function is provided which includes detecting an error based on read data with test data, performing at least one of an error correction operation or a redundancy repair operation of the read data if the number of errors detected is less than a desired value, and selectively performing the at least one of error correction operation and the redundancy repair operation of the read data based on a redundancy repair flexibility if the number of errors detected is more than the desired value.

At least one example embodiment discloses a semiconductor memory device including a first plurality of cells configured to store read data, a second plurality of cells configured to store parity data, and a test circuit configured to determine a number of errors in at least one of the read data and the parity data based on test data and correct the errors based on the number of errors, the test circuit further configured to determine the number of errors by ignoring the at least one of the read data and the parity data having a first value.

BRIEF DESCRIPTION OF THE FIGURES

The above and other features and advantages of example embodiments of inventive concepts will become more apparent by describing in detail example embodiments of inventive concepts with reference to the attached drawings. The accompanying drawings are intended to depict example embodiments of inventive concepts and should not be interpreted to limit the intended scope of the claims. The accompanying drawings are not to be considered as drawn to scale unless explicitly noted.

DETAILED DESCRIPTION

Figure 1:
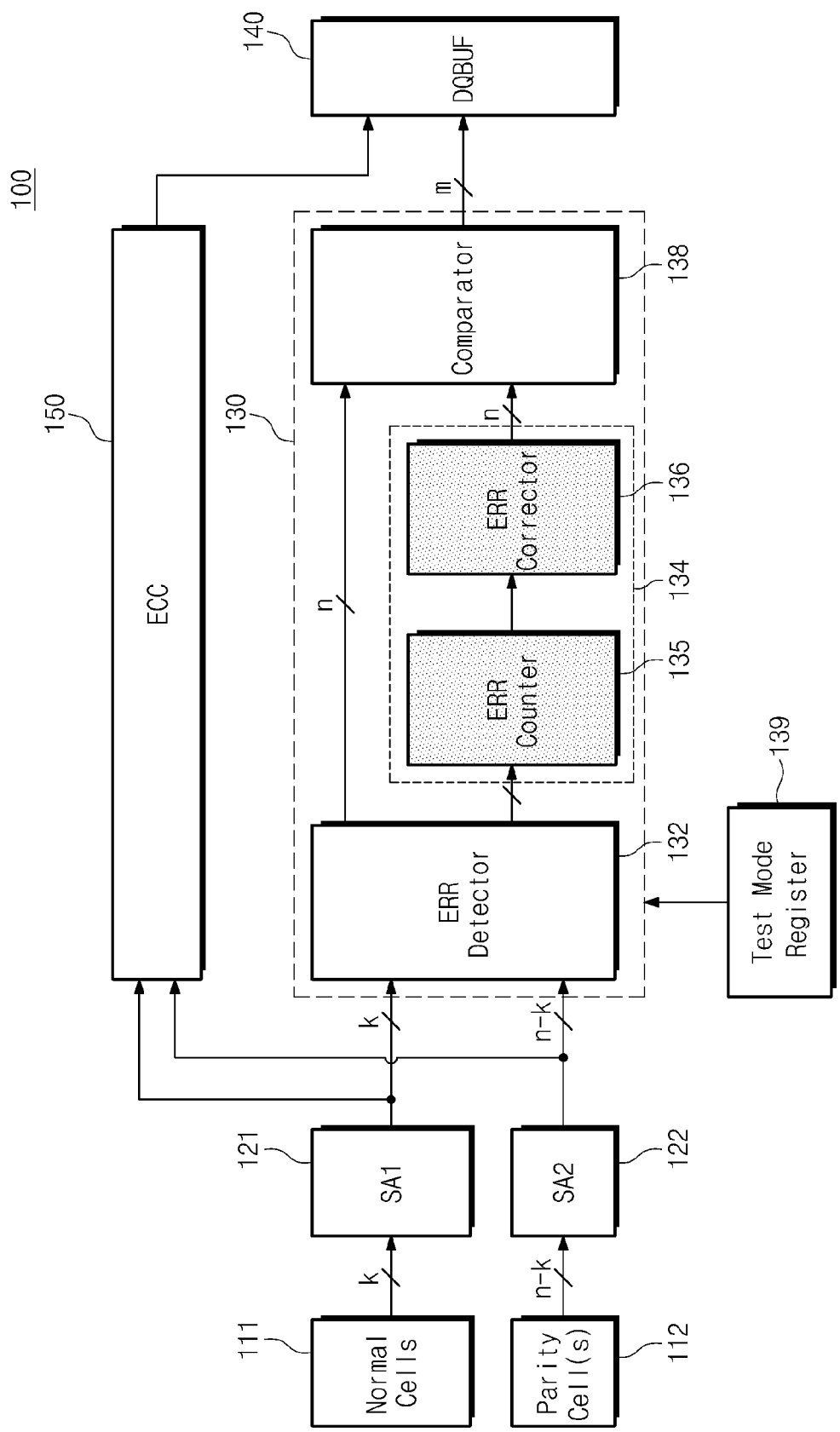
FIG. 1 is a block diagram schematically illustrating a semiconductor memory device according to an example embodiment of inventive concepts.

Detailed example embodiments of inventive concepts are disclosed herein. However, specific structural and functional details disclosed herein are merely representative for purposes of describing example embodiments of inventive concepts. Example embodiments of inventive concepts may, however, be embodied in many alternate forms and should not be construed as limited to only example embodiments set forth herein.

Accordingly, while example embodiments of inventive concepts are capable of various modifications and alternative forms, embodiments thereof are shown by way of example in the drawings and will herein be described in detail. It should be understood, however, that there is no intent to limit example embodiments of inventive concepts to the particular forms disclosed, but to the contrary, example embodiments of inventive concepts are to cover all modifications, equivalents, and alternatives falling within the scope of example embodiments of inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

A semiconductor memory device and its test method according to an example embodiment of inventive concepts selectively perform an error correction operation and/or a redundancy repair operation at a test operation.

FIG. 1 is a block diagram schematically illustrating a semiconductor memory device according to an example embodiment of inventive concepts. Referring to FIG. 1, a semiconductor memory device 100 includes normal cells 111, at least one parity cell 112, first and second sense amplifiers 121 and 122, a test circuit 130, an input/output buffer 140, and an ECC circuit 150.

The normal cells 111 and parity cell 112 are implemented with memory cells having the same structure. Here, the memory cells may be volatile memory cells.

Each of the normal cells 111 stores data, and the parity cell 112 stores parity data corresponding to the data. Here, the ECC circuit 150 may generate the parity data using an error correction code (ECC). In an example embodiment, the semiconductor memory device 100 includes on-chip ECC functionality.

The first sense amplifier 121 reads data bits stored in the normal cells 111. Here, read data is k-bit data. The second sense amplifier 122 reads parity bits stored in the parity cells 112. Here, the read parity data is (n-k)-bit data. Here, "n" indicates the size of code word.

During a test operation, the test circuit 130 detects an error of data stored in the normal cells 111 or an error of parity data stored in the parity cells 112, determines whether data read from the normal cells 111 or parity data read from the parity cells 112 is correctable, based on the number of errors detected, and outputs the read data, parity data or the corrected data according to the determination result.

In an example embodiment, the test circuit 130 is activated during a test operation. For example, whether to activate the test circuit 130 is decided based on test mode register set information (hereinafter, TMRS information)

from a test mode register 139. The test mode register 139 may be an external tester at a test operation.

In an example embodiment, the test circuit 130 performs error correction on the read data or read parity data or redundancy repairing on the read data or read parity data, based on the TMRS information.

The test circuit 130 includes an error detector 132, a test ECC circuit 134, and a comparator 138.

The error detector 132 detects an error by comparing data read via the first sense amplifier 121 with test data or by comparing parity data read via the second sense amplifier 122 with test parity data. The test data and the test parity may be provided from an external device (e.g., a tester) at a test operation.

The error detector 132 performs comparison and error detection under the condition that data "1" or data "0" stored in the normal cells 111 or parity cells 112 is selectively ignored. Here, to selectively ignore means that selected data "1" or data "0" is all passed regardless of pass/fail.

The test ECC circuit 134 counts the number of errors detected from the error detector 132 and performs an error correction operation or a redundancy repair operation based on the number of errors thus counted. The test ECC circuit 134 includes an error counter 135 and an error corrector 136.

The error counter 135 counts the number of errors of read data or the number of errors of read parity data. The error counter 135 adjusts the number of errors thus counted according to redundancy repair flexibility. For example, errors capable of being redundancy repaired are excluded from counting the number of errors.

When the number of errors thus counted or the number of errors thus adjusted is smaller than a predetermined and/or desired value, the error corrector 136 corrects an error of read data or an error of read parity data. The predetermined and/or desired value may be based on empirical data.

The comparator 138 compresses read data/parity data or corrected data/parity data by a predetermined unit and outputs compressed data/parity data. Here, the predetermined unit is the number of bit lines to which a signal of a column selection line is simultaneously provided. Here, compression means that whether data bits are equal to one another by the predetermined unit is determined through comparison and a comparison result value associated with the determination result is output. That is, memory cells in the predetermined unit are simultaneously tested: a parallel bit test (PBT) is performed.

The input/output buffer 140 stores data/parity data output from the test circuit 130. Here, the data/parity data stored in the input/output buffer 140 is m-bit data. The data/parity data stored in the input/output buffer 140 is provided to an external device as a test result.

Meanwhile, the semiconductor memory device 100 shown in FIG. 1 includes the ECC circuit 150. However, inventive concepts are not limited thereto. For example, the ECC circuit 150 may not be included in the semiconductor memory device 100.

The ECC circuit 150 generates at least one parity bit corresponding to a data bit using an error correction code at a write operation and corrects an error of read data based on read parity data at a read operation. Here, the write and read operations are write and read operations of a normal operating mode, not a test operating mode.

In an example embodiment, the ECC circuit 150 is inactivated at a test operation.

The semiconductor memory device 100 according to an example embodiment of inventive concepts performs error correction about data or parity data and performs a test operation, when the ECC circuit 150 is disabled.

Also, the semiconductor memory device 100 according to an example embodiment of inventive concepts outputs corrected data/parity data according to the number of errors detected/adjusted at a test operation; hence, yield is improved compared with a conventional technique.

FIGS. 2 to 6 are block diagrams schematically illustrating test circuits shown in FIG. 1, according to example embodiments of inventive concepts.

Figure 2:
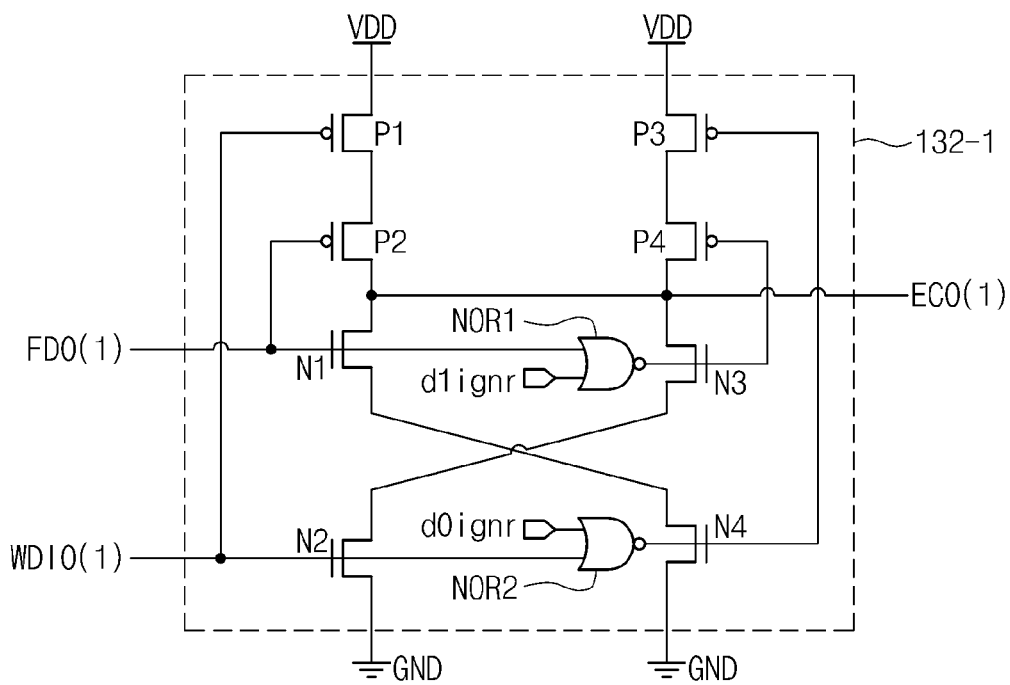
FIG. 2 shows an example embodiment of an error detector in a test circuit shown in FIG. 1.
Figure 2:
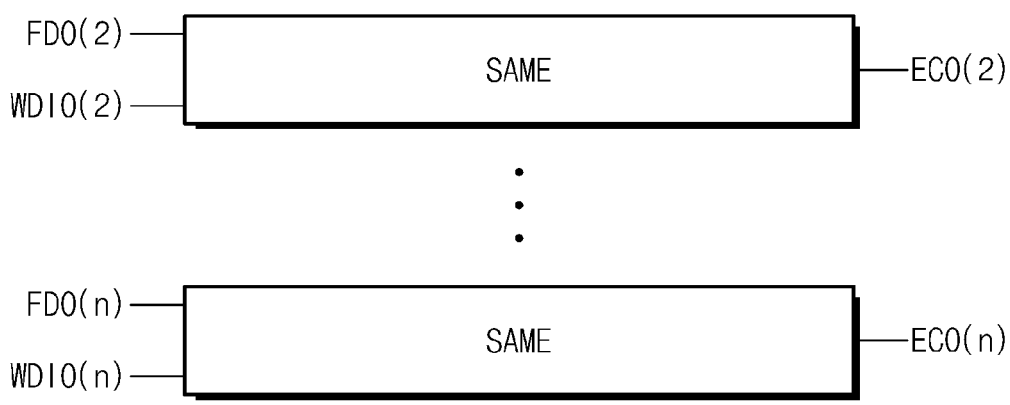

FIG. 2 shows an example embodiment of an error detector 132 in the test circuit 130 shown in FIG. 1. Referring to FIG. 2, an error detector 132 includes a plurality of error detection circuits. An error detection circuit 132-1, as illustrated in FIG. 2, includes PMOS transistors P1 to P4, NMOS transistors N1 to N4, and logic circuits NOR1 and NOR2. Regardless of pass/fail of read data "0" or "1", the error detection circuit 132-1 compares a read data bit FDO(1) and a test data bit WDIO(1) in response to data ignore TMRS signals d0ignr and d1ignr and outputs a comparison result ECO(1) indicating whether the read data bit FDO(1) and the test data bit WDIO(1) are equal to each other.

The following table shows an error detection operation of the error detection circuit 132-1 shown in FIG. 2.

TABLE 1

| FDO (read data) | WDIO (test data) | d1ignor | d0ignor | ECO (Output) | Result |
|---|---|---|---|---|---|
| H ("1") | H ("1") | L ("Off") | L ("Off") | H | Pass |
| H | H | H ("On") | L | H | Pass |
| L ("0") | H | L | L | L | Fail |
| L | H | H | L | H | Pass |
| L | L ("0") | L | L | H | Pass |
| L | L | L | H ("On") | H | Pass |
| H | L | L | L | L | Fail |
| H | L | L | H | H | Pass |

Referring to FIG. 2 and table 1, the error detector 132 compares read data FDO(1) to FDO(n) and test data WDIO (1) to WDIO(n) in response to the data ignore TMRS signals d0ignr and d1ignr and outputs comparison result values ECO(1) to ECO(n) as a result of an error detection operation.

The error detection circuit 132-1 of inventive concepts is not limited to logic circuits shown in FIG. 2.

The error detector 132 according to at least one example embodiment of inventive concepts performs an error detection operation under the condition that either one of read data "0" and read data "1" is ignored.

Figure 3:
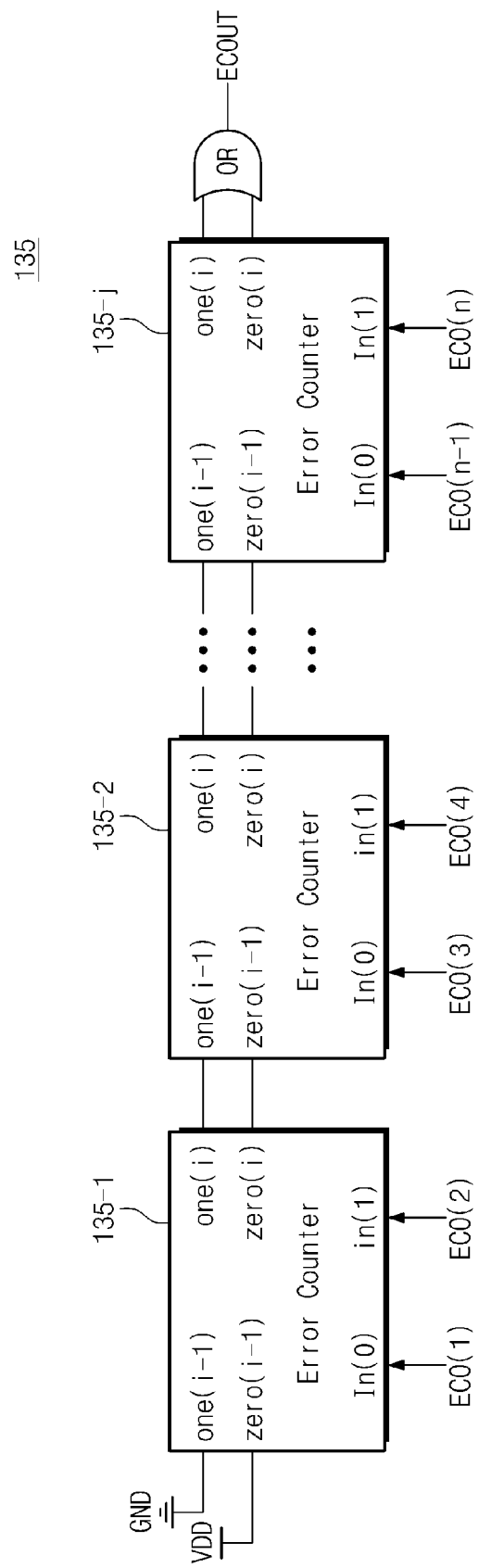
FIG. 3 is a block diagram schematically illustrating an error counter in a test circuit shown in FIG. 1 according to an example embodiment.

FIG. 3 is a block diagram schematically illustrating an error counter 135 in a test circuit 130 shown in FIG. 1. Referring to FIG. 3, an error counter 135 includes a plurality of error counting circuits 135-1 to 135-j (j being an integer of 2 or more) and a logic circuit OR.

The error counter 135 shown in FIG. 3 may be implemented to indicate the presence of zero errors, one errors or more than one error. For example, the error counter 135 outputs a corresponding voltage "H" to a terminal zero(i) when an error does not exist, a corresponding voltage "H" to a terminal one(i) when one error exists, and a corresponding voltage "L" to the terminal one(i) when two or more errors exist.

As illustrated in FIG. 3, the error counting circuits 135-1 to 135-j are cascaded. In FIG. 3, "n" indicates the size of a code word.

If the number of errors counted is zero, terminals zero(i) and one(i) of the last error counting circuit 135-j are set to "H" and "L", respectively. Thus, an output value ECOUT of the logic circuit OR is set to "H". If the number of errors counted is 1, the terminals zero(i) and one(i) of the last error counting circuit 135-j are set to "L" and "H", respectively. Thus, the output value ECOUT of the logic circuit OR is set to "H". In contrast, if the number of errors counted is two or more, the terminals zero(i) and one(i) of the last error counting circuit 135-j are set to "L" and "L", respectively. Thus, the output value ECOUT of the logic circuit OR is set to "L".

As described above, the output value ECOUT of the error counter 135 is a value of determining and directing whether to correct an error of read data/parity data.

Figure 4:
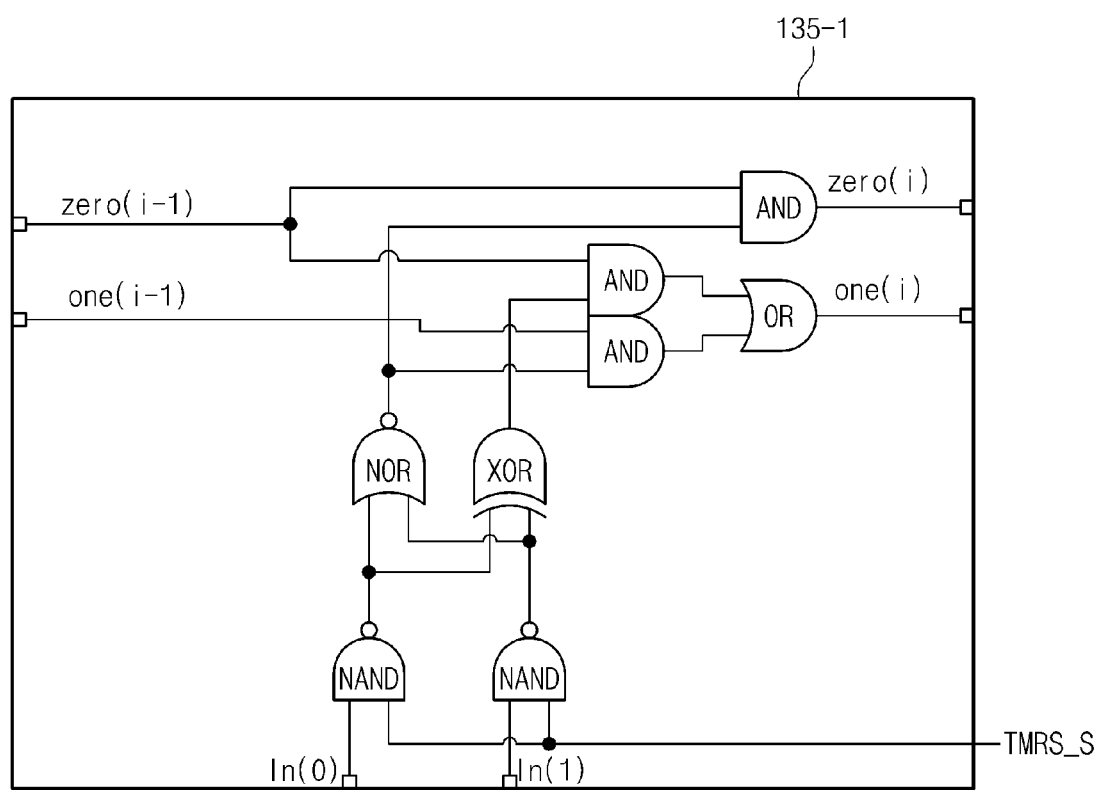
FIG. 4 is a circuit diagram schematically illustrating an error counting circuit shown in FIG. 3 according to an example embodiment.

FIG. 4 is a circuit diagram schematically illustrating an error counting circuit shown in FIG. 3. Referring to FIG. 4, an error counting circuit 135-1 logically operates voltages of output terminals zero(i−1) and one(i−1) of a previous-stage error counting circuit and voltages of input terminals In(0) and In(1) receiving output values of error detection circuits in response to an TMRS signal TMRS_S indicating whether an error counter 135 is activated, and it outputs an operating value indicating whether or not an error is generated.

For example, when the number of errors is 0, an output terminal zero(i) is set to "H". When the number of errors is 1, an output terminal one(i) is set to "H".

Remaining error counting circuits 135-2 to 135-j are implemented the same as that shown in FIG. 4.

The error counting circuit 135-1 according to an example embodiment of inventive concepts is enabled in response to the TMRS signal TMRS_S having "H" and is disabled in response to the TMRS signal TMRS_S having "L".

Figure 5:
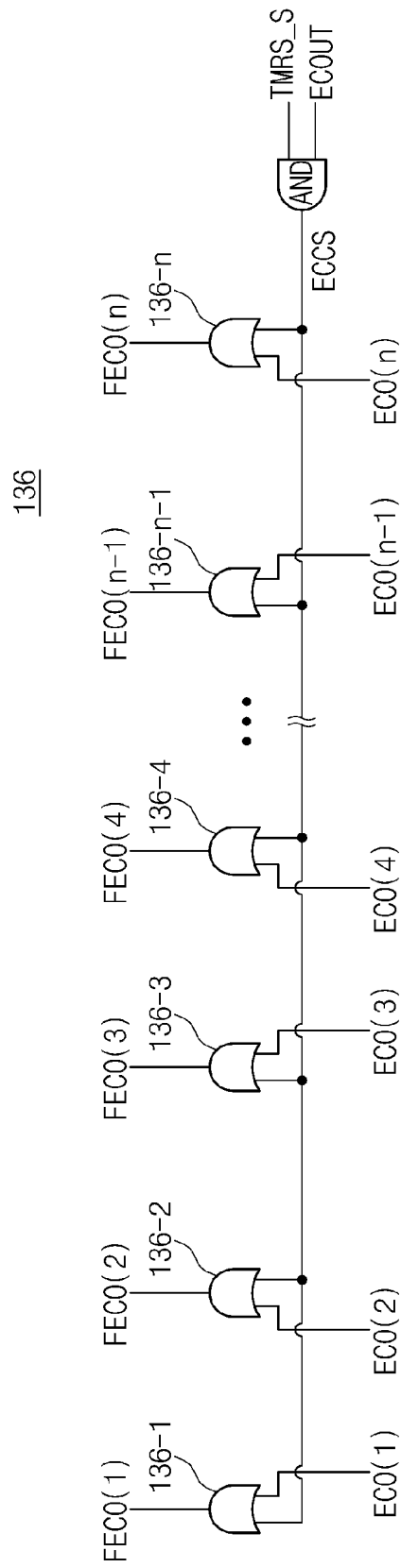
FIG. 5 is a circuit diagram schematically illustrating an error corrector in a test circuit shown in FIG. 1 according to an example embodiment.

FIG. 5 is a circuit diagram schematically illustrating an error corrector 136 in a test circuit 130 shown in FIG. 1. Referring to FIG. 5, an error corrector 136 includes logic circuits 136-1 to 136-n for correcting an error of error detection result values ECO(1) to ECO(n) in response to an error correction signal ECCS. Here, the error correction signal ECCS, as illustrated in FIG. 5, is generated by ANDing an output value ECOUT of the error counter 135 and the TMRS signal TMRS_S. The TMRS signal TMRS_S indicates whether or not error correction is performed. When a signal has "H" or "L", this refers to the signal have a voltage level corresponding to "H" or "L."

If the TMRS signal TMRS_S has "H", an error counter 135 is disabled; hence, error detection is not performed at a test operation. In that case, the error detection result values ECO(1) to ECO(n) are output as output values FECO(1) to FECO(n) of the error corrector 136 without error correction.

In contrast, if the TMRS signal TMRS_S has "L", the error counter 135 is enabled; hence, error detection is performed at a test operation. Below, it is assumed that the number of errors as an error correction reference is 1.

As described with reference to FIG. 3, if the number of errors counted is 0 or 1, the output value ECOUT of the error counter 135 is set to "H". Thus, the logic circuits 136-1 to 136-n all output "H" regardless of the error detection result values ECO(1) to ECO(n). That is, the output values FECO(1) to FECO(n) of the error corrector 136 all have "H".

In contrast, if the number of errors counted is 2 or more, the output value ECOUT of the error counter 135 is set to "L". Thus, the logic circuits 136-1 to 136-n output the error detection result values ECO(1) to ECO(n) as the output values FECO(1) to FECO(n) of the error corrector 136.

The error corrector 136 outputs the error detection result values ECO(1) to ECO(n) without correction in response to the error correction signal ECCS indicating whether or not an error is correctable, or it corrects and outputs the error detection result values ECO(1) to ECO(n) in response to the error correction signal ECCS.

The test circuit 130 according to at least one example embodiment of inventive concepts counts errors of data and/or parity data and performs an error correction operation and/or a redundancy repair operation according to the number of errors counted. In an example embodiment, the test circuit 130 of inventive concepts counts errors of data and performs an error correction operation and/or a redundancy repair operation according to the number of errors counted. In another example embodiment, the test circuit 130 of inventive concepts counts errors of parity data and performs an error correction operation and/or a redundancy repair operation according to the number of errors counted. Alternatively, the test circuit 130 of inventive concepts counts errors of data and errors of parity data and performs an error correction operation and/or a redundancy repair operation according to a count result. Meanwhile, if necessary, the test circuit 130 according to at least one example embodiment of inventive concepts may be implemented to select a counting target.

Figure 6:
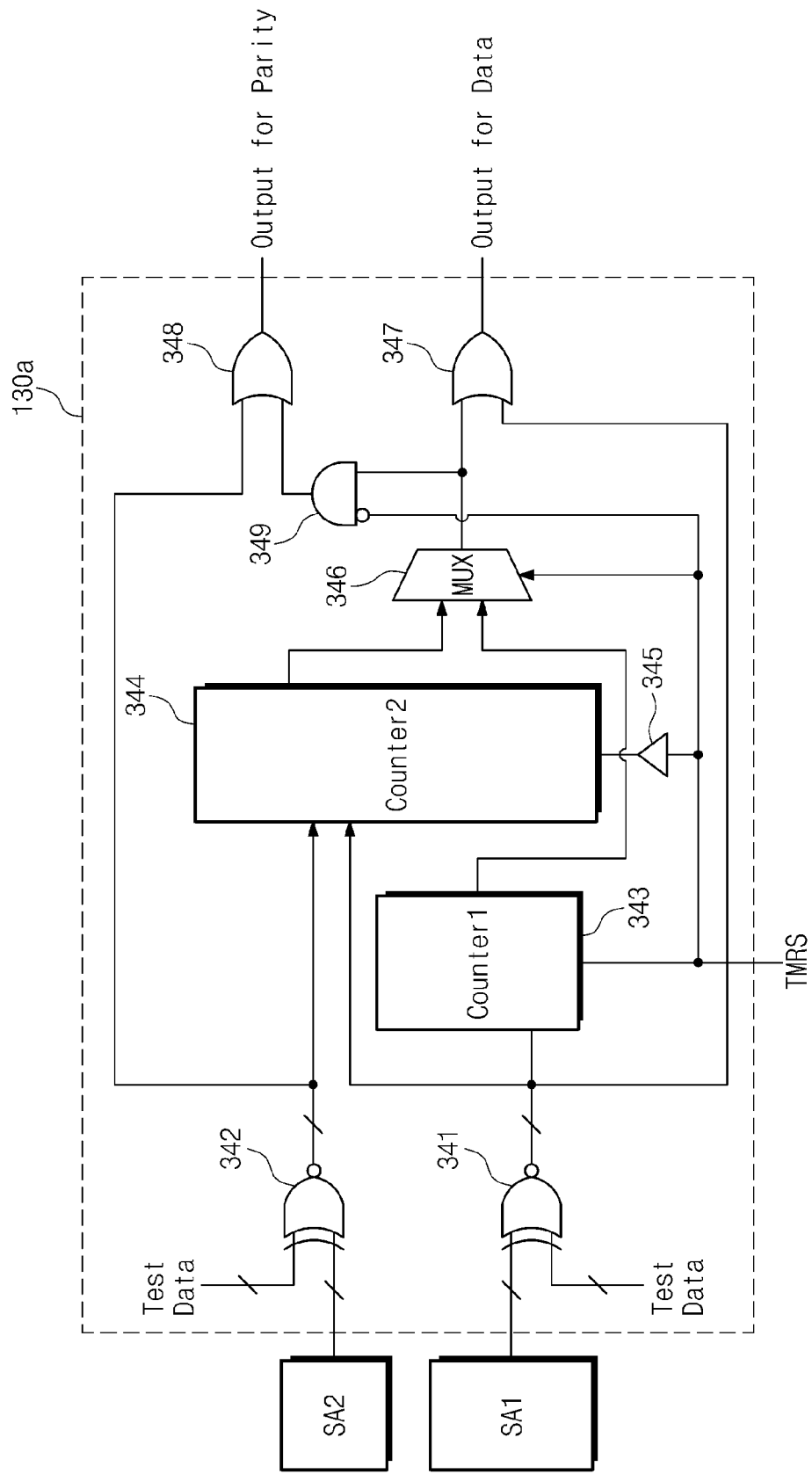
FIG. 6 a block diagram schematically illustrating a test circuit shown in FIG. 1 according to an example embodiment.

FIG. 6 a block diagram schematically illustrating another example embodiment of a test circuit that may be implemented in the semiconductor memory device 100. Referring to FIG. 6, a test circuit 130a includes first and second XNOR operators 341 and 342, first and second counters 343 and 344, an inverter 345, a multiplexer 346, first and second OR operators 347 and 348, and an AND operator 349.

The first XNOR operator 341 performs an XNOR operation about data read from normal cells and test data to detect an error. The second XNOR operator 342 performs an XNOR operation about parity data read from parity cells and test parity data to detect an error.

The first counter 343 detects the number of errors included in the data from output values of the first XNOR operator 341. In an example embodiment, the first counter 343 may detect the number of errors included in the data. Also, the first counter 343 may output a result value indicating whether or not the number of errors is less than a predetermined and/or desired value.

The second counter 344 detects the number of errors of the data and the parity data from output values of the first XNOR operator 341 and output values of the second XNOR operator 342, based on TMRS information. In an example embodiment, the second counter 344 detects the number of errors of data and parity data. Here, the TMRS information provided to the second counter 344 is an inverted version of the TMRS signal and the first counter 343 receives the TMRS signal. That is, one of the first counter 343 and the second counter 344 is activated.

Also, the second counter 344 outputs a result value indicating whether or not the number of errors is less than the predetermined and/or desired value. The inverter 345 inverts a signal associated with the TMRS information to output it to the second counter 344. The multiplexer 346 selects one of output values of the first and second counters 343 and 344 in response to the TMRS information.

The first OR operator 347 performs an OR operation on an output value of the multiplexer 346 and output values of the first XNOR operator 341 to output values for data. Here, the output values are corrected data or read data. The second OR operator 348 performs an OR operation on output values of the second XNOR operator 342 and an output of the AND operator 349. The AND operator 349 outputs a value associated with both the TMRS information and an output value of the multiplexer 346 to output a value for parity data. Here, the value output from the second OR operator 348 is corrected parity data or read parity data.

The AND operator 349 performs an AND operation about an inverted version of signal associated with the TMRS information and an output value of the multiplexer 346 to output a resultant value to the second OR operator 348.

The test circuit 130a according to an example embodiment of inventive concepts counts the number of errors of data or counts the number of errors in the data or the number of errors in the parity data, based on the TMRS information.

Figure 7:
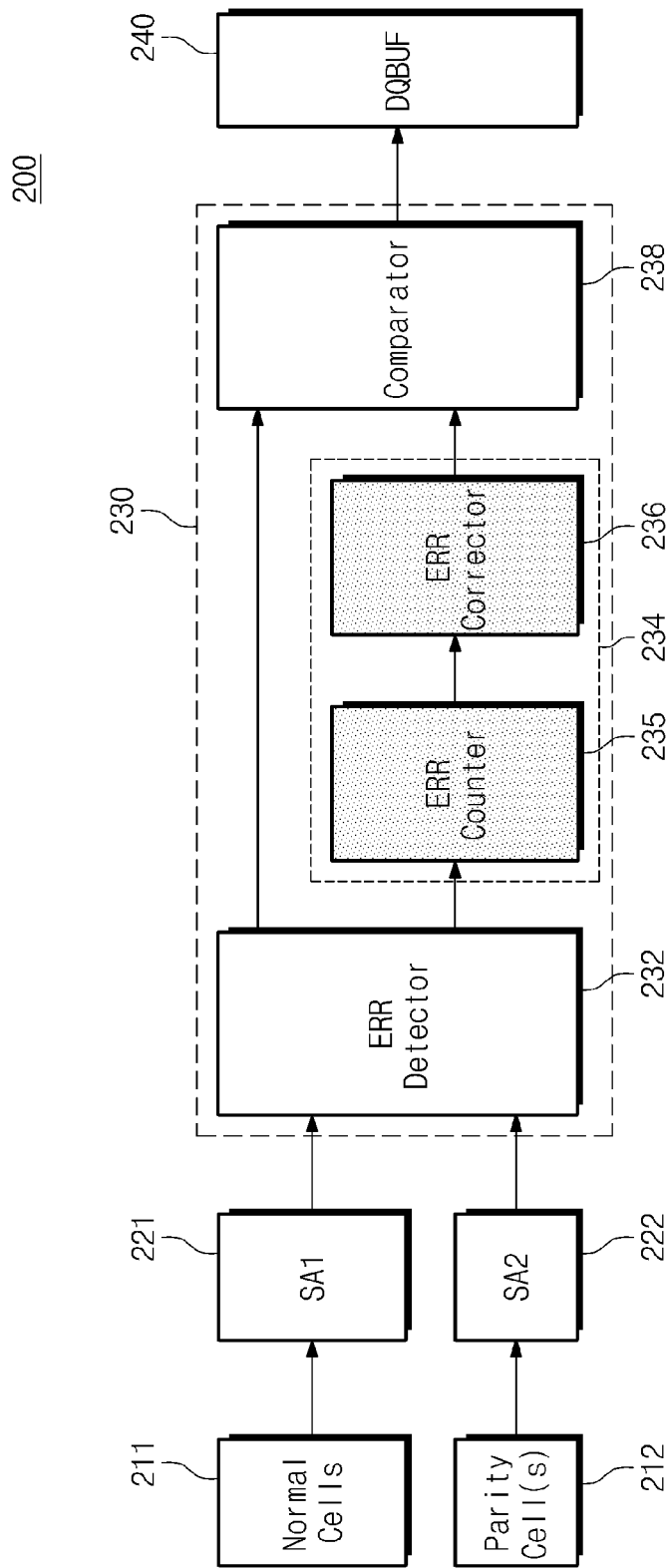
FIG. 7 is a block diagram schematically illustrating a semiconductor memory device according to an example embodiment of inventive concepts.

FIG. 7 is a block diagram schematically illustrating a semiconductor memory device according to an example embodiment of inventive concepts. Referring to FIG. 7, a semiconductor memory device 200 includes normal cells 211, parity cells 212, first and second sense amplifiers 221 and 222, a test circuit 230, a comparator 238, and an input/output buffer 240.

The normal cells 211, the parity cells 212, the first and second sense amplifiers 221 and 222, the test circuit 230, and the input/output buffer 240 are configured substantially the same as those in FIG. 1. The semiconductor memory device 200 is configured not to include an ECC circuit shown in FIG. 1. An external device performs an error correction operation about data normally input and output to and from the semiconductor memory device 200.

In FIGS. 1 to 7, a plurality of memory cells may be tested in parallel. This test operation is referred to as a parallel bit test (PBT) operation. However, inventive concepts are not limited thereto. A test circuit of inventive concepts may be configured to test memory cells independently, not simultaneously (non-PBT).

Figure 8:
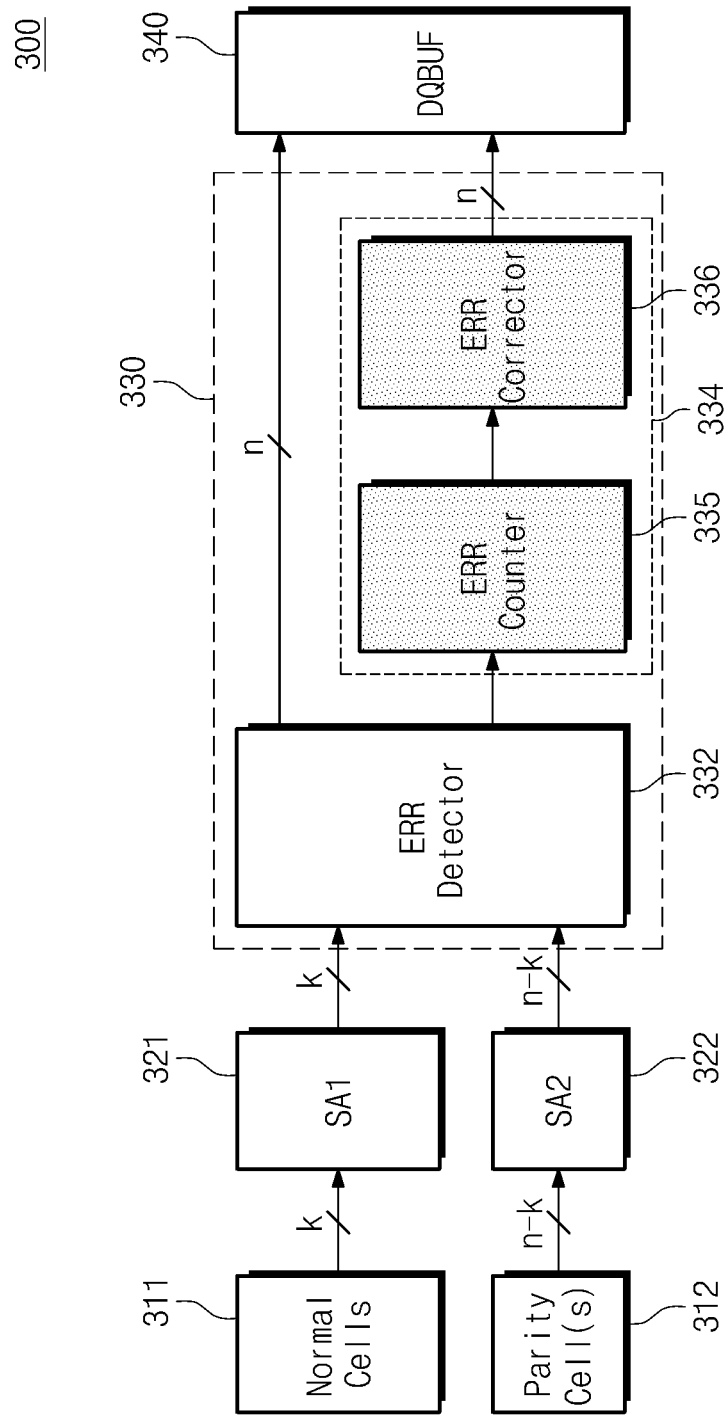
FIG. 8 is a block diagram schematically illustrating a semiconductor memory device according to an example embodiment of inventive concepts.

FIG. 8 is a block diagram schematically illustrating a semiconductor memory device according to another example embodiment of inventive concepts. Referring to FIG. 8, a semiconductor memory device 300 includes normal cells 311, parity cells 312, first and second sense amplifiers 321 and 322, a test circuit 330, and an input/output buffer 340. The semiconductor memory device 300 is configured substantially the same as that in FIG. 1 except for the test circuit 330. The test circuit 330 is different from the test circuit 130 shown in FIG. 1 in that a comparator 138 is excluded. The input/output buffer 340 stores/outputs corrected n-bit data and parity data or read n-bit data or parity data.

In an example embodiment, the test circuit 330 uses a structure of the test circuit 130 shown in FIG. 1, but it selects a PBT operation or a non-PBT operation based on TMRS information.

The semiconductor memory device 300 according to inventive concepts corrects an error of data/parity data and performs a non-PBT mode test operation.

Meanwhile, the semiconductor memory device 300 according to inventive concepts performs an operation of counting errors considering redundancy repair at a test operation. For example, the number of errors may be counted to reduce the number of errors by the number of errors, capable of being repaired, from among errors detected. This will be more fully described below.

Figure 9:
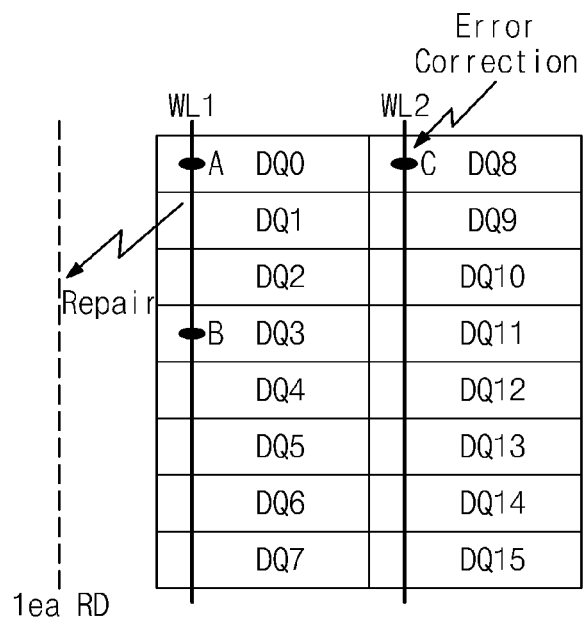
FIG. 9 is a diagram schematically illustrating an error correction method considering redundancy repair at a test operation, according to an example embodiment of inventive concepts.

FIG. 9 is a diagram schematically illustrating an error correction method considering redundancy repair at a test operation, according to an example embodiment of inventive concepts. As shown in FIG. 9, an error correction method is described under the following conditions: a redundancy word line RD is provided, the size of DQ is 16, a word line is connected to eight memory cells, and errors are detected from memory cells A, B, and C. With the conditions, errors of the memory cells A and B connected to a first word line WL1 are repaired by memory cells connected to the redundancy word line. Also, the memory cell C connected to a second word line WL2 is correctable.

A redundancy structure shown in FIG. 9 is an example. As a redundancy structure is variously changed, adjustment about the number of errors counted is variously modified.

The redundancy repair may be performed by the test ECC circuit 134.

In an example embodiment, a counting adjustment of the number of errors considering a redundancy repair operation in a test mode is selectively performed.

The test operation of inventive concepts decides whether to correct errors of a read code word (including read data and read parity data) considering the number of errors counted and a redundancy repair structure.

A semiconductor memory device according to an example embodiment of inventive concepts is a volatile memory device (e.g., DRAM).

Figure 10:
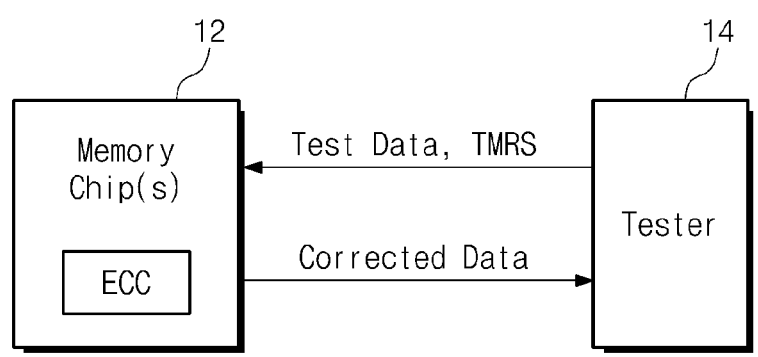
FIG. 10 is a block diagram schematically illustrating a test system according to an example embodiment of inventive concepts.

FIG. 10 is a block diagram schematically illustrating a test system 10 according to an example embodiment of inventive concepts. Referring to FIG. 10, a test system 10 includes at least one memory chip 12 and a tester 14. The memory chip 12 is a semiconductor memory device 100 shown in FIG. 1, a semiconductor memory device 200 shown in FIG. 7, or a semiconductor memory device 300 shown in FIG. 8.

The tester 14 provides the memory chip 12 with TMRS information and test data (including test data and test parity data). Based on the TMRS information from the tester 14, the memory chip 12 detects an error of read data, corrects the detected error, and sends the corrected data to the tester 14.

As the test system 10 selectively performs error correction and/or redundancy repair at a test operation, yield is maximized.

Figure 11:
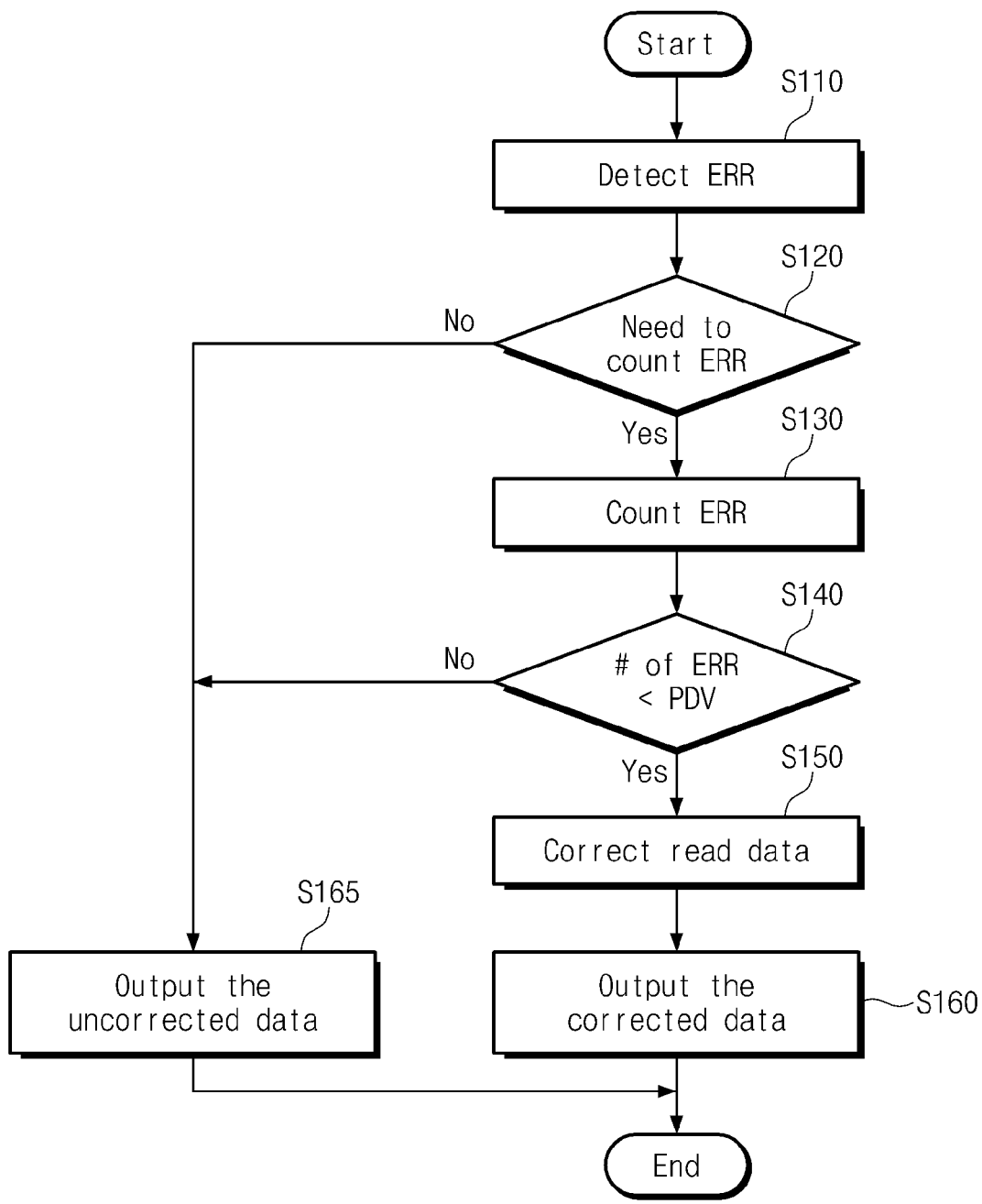
FIG. 11 is a flow chart schematically illustrating a test method of a semiconductor memory device, according to an example embodiment of inventive concepts.

FIG. 11 is a flow chart schematically illustrating a test method of a semiconductor memory device, according to an example embodiment of inventive concepts. Below, the test method of FIG. 11 may be performed by the semiconductor memory device 100, 200 or 300.

In S110, errors of read data (including data and parity data) are detected using test data (including test data and test parity data). In S120, whether to count the number of errors detected is determined based on TMRS information. If so, the method proceeds to step S130. If not, the method proceeds to step S165. In step S130, the number of errors included in the read data is counted. In step S140, whether the number of errors counted is less than a predetermined and/or desired value is determined. If the number of errors counted is less than the predetermined and/or desired value, in step S150, the read data is corrected. In step S160, the corrected data is output to an external device. When to count the number of errors detected is not required or when the number of errors counted is more than the predetermined and/or desired value, in step S165, the read data is output to the external device.

The test method shown in FIG. 11 selects whether to count errors and corrects errors of read data according to the number of errors.

Figure 12:
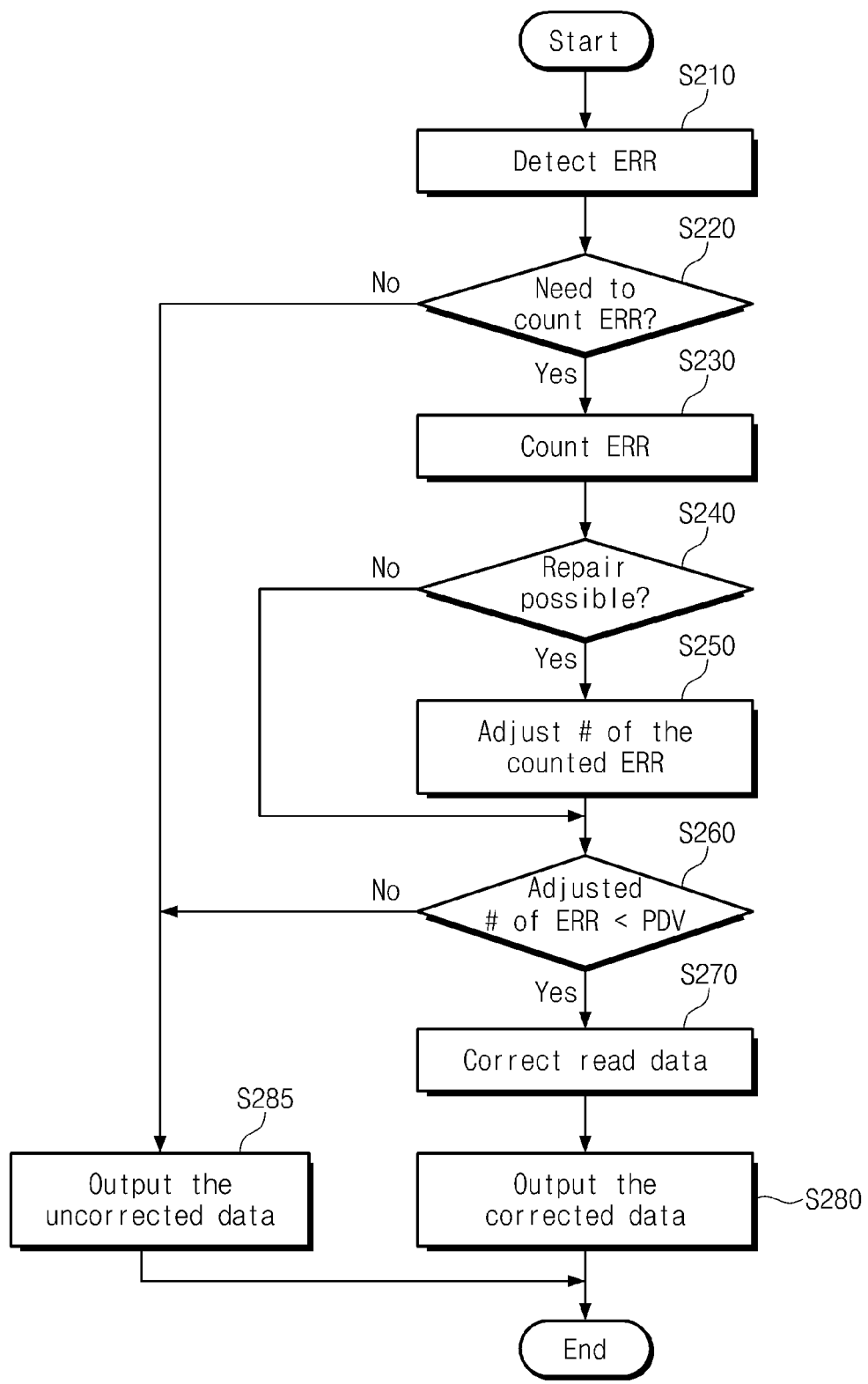
FIG. 12 is a flow chart schematically illustrating a test method of a semiconductor memory device, according to an example embodiment of inventive concepts.

FIG. 12 is a flow chart schematically illustrating a test method of a semiconductor memory device, according to another example embodiment of inventive concepts. Below, the method of FIG. 12 may be performed by the semiconductor memory device 100, 200 or 300.

In S210, errors of read data (including data and parity data) are detected using test data (including test data and test parity data). In S220, whether to count the number of errors detected is determined based on TMRS information. If so, the method proceeds to step S230. If not, the method proceeds to step S285. In step S230, the number of errors included in the read data is counted. In step S240, whether the detected errors include errors capable of being redundancy repaired is determined. If so, the method proceeds to step S250. If not, the method proceeds to step S260. In step S250, the number of errors counted is adjusted. That is, there is reduced the number of errors by the number of errors, capable of being redundancy repaired, from among the detected errors. Afterwards, the method proceeds to step S260.

In step S260, whether the number of errors counted/adjusted is less than a predetermined and/or desired value PDV is determined. If the number of errors counted/corrected is less than the predetermined value PDV, in step S270, the read data is corrected. In step S280, the corrected data is output to an external device. When to count the number of errors detected is not required or when the number of errors counted is more than the predetermined and/or desired value PDV, in step S285, the read data is output to the external device.

The test method according to an example embodiment of inventive concepts selects whether to count errors, adjusts the number of errors according to possibility of repair, and corrects errors of read data according to the number of errors adjusted.

Figure 13:
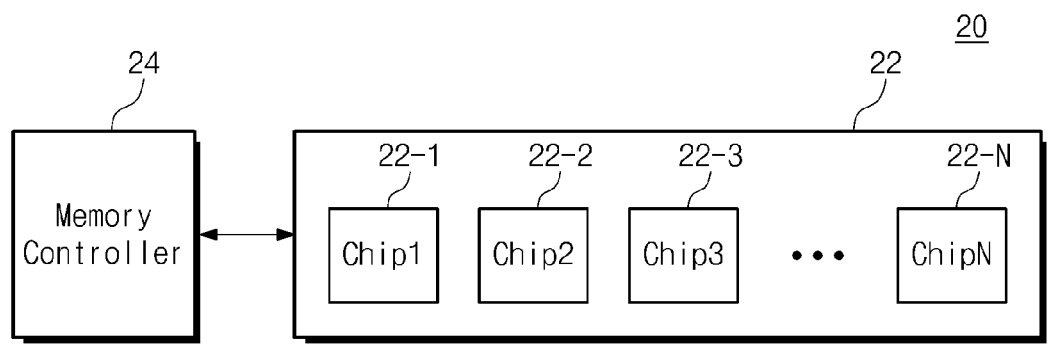
FIG. 13 is a block diagram schematically illustrating a memory system according to an example embodiment of inventive concepts.
Figure 14:
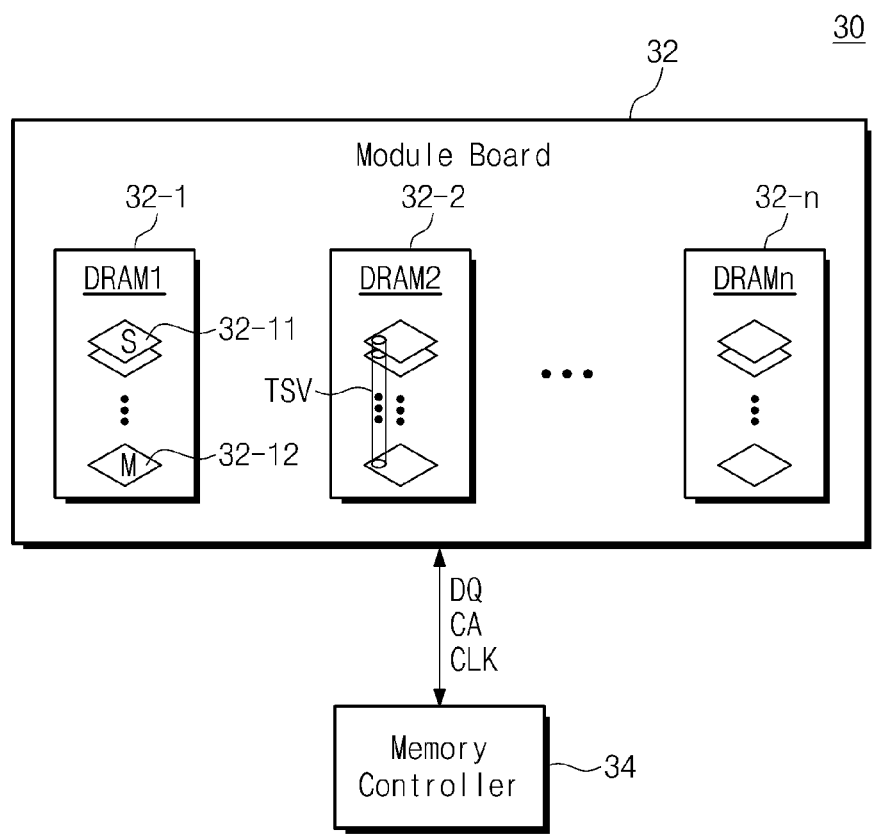
FIG. 14 is a block diagram schematically illustrating a memory system according to another example embodiment of inventive concepts.

FIGS. 13 and 14 are block diagrams schematically illustrating example embodiments to which a semiconductor memory device according to an example embodiment of inventive concepts is applied. FIG. 13 is a block diagram schematically illustrating a memory system 20 according to an example embodiment of inventive concepts. Referring to FIG. 13, a memory system 20 includes a memory module 22 and a memory controller 24 controlling the memory module 22. The memory module 22 includes a plurality of chips 22-1 to 22-N, each of which is implemented to select whether to correct errors and/or whether to repair at a test operation as described with reference to FIGS. 1 to 12.

FIG. 14 is a block diagram schematically illustrating a memory system 30 according to another example embodiment of inventive concepts. Referring to FIG. 14, a memory system 30 includes a memory module 32 and a memory controller 34 controlling the memory module 32.

The memory module 32 includes a plurality of semiconductor memory devices 32-1 to 32-n that is mounted on a module board. Each of the semiconductor memory devices 32-1 to 32-n has such a structure that a plurality of DRAM chips stacked. Here, each of the semiconductor memory devices 32-1 to 32-n includes at least one master chip 32-11 and at least one slave chip 32-12. The master chip 32-11 and the slave chip 32-12 receive and transmit signals using through silicon via (TSV). The master chip 32-11 exchanges a clock signal CLK, a command/address signal CA, and data DQ with the external memory controller 34. The master chip 32-11 transfers the input signals to the slave chip 32-22 via the TSV, or it provides signals from the slave chip 32-12 to the external memory controller 34.

Each of the master chip 32-11 and the slave-chip 32-22 is implemented to select whether to correct errors and/or whether to repair at a test operation as described with reference to FIGS. 1 to 12.

Inventive concepts are applicable to a mobile device.

Figure 15:
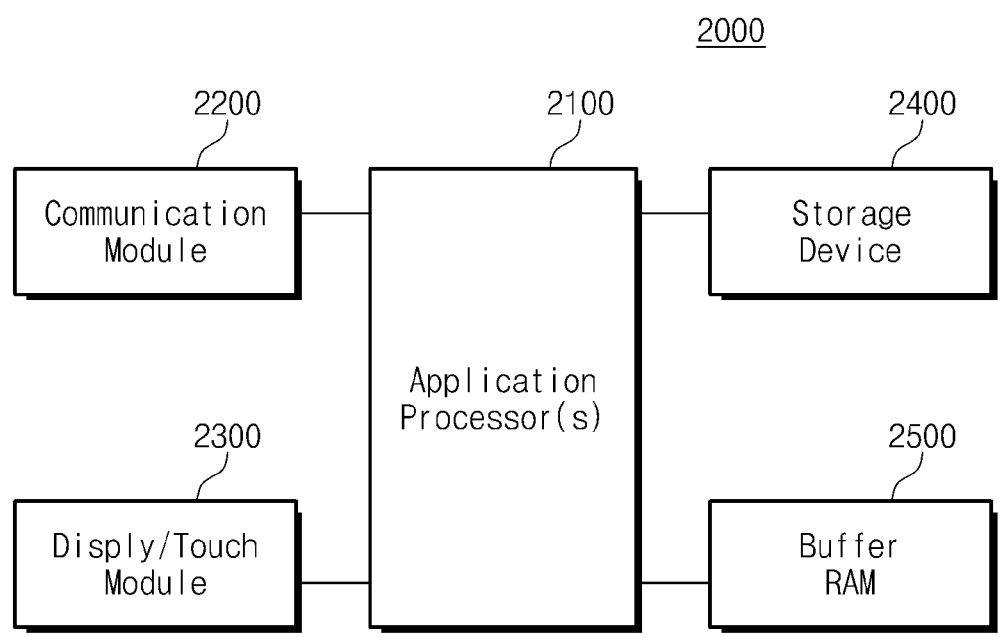
FIG. 15 is a block diagram schematically illustrating a mobile device according to an example embodiment of inventive concepts.

FIG. 15 is a block diagram schematically illustrating a mobile device 2000 according to an example embodiment of inventive concepts. Referring to FIG. 15, a mobile device 2000 includes an application processor 2100, a communication module 2200, a display/touch module 2300, a storage device 2400, and a buffer RAM 2500.

The application processor 2100 controls an overall operation of the mobile device 2000. The communication module 2200 is implemented to perform wireless or wire communications with an external device. The display/touch module 2300 is implemented to display data processed by the application processor 2100 or to receive data through a touch panel. The storage device 2400 is implemented to store user data. The storage device 2400 is an embedded multimedia card (eMMC), solid state disk (SSD), or universal flash storage (UFS) device.

The buffer RAM 2500 is configured to temporarily store data needed for a processing operation of the mobile device 2000. The buffer RAM 2500 is implemented to select whether to correct errors and/or whether to repair at a test operation as described with reference to FIGS. 1 to 12.

A memory system or a storage device according to inventive concepts may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While inventive concepts has been described with reference to example embodiments, it will be apparent to those skilled in the art that various changes and modifications may be made without departing from the spirit and scope of inventive concepts. Therefore, it should be understood that the above example embodiments are not limiting, but illustrative.

What is claimed is:

1. A semiconductor memory device comprising:
    memory cells;
    a first error correction code (ECC) circuit configured to generate at least one selected parity bit corresponding to a selected data bit using an error correction code during a write operation and to correct an error of the selected data bit using the selected parity bit during a read operation; and
    a test circuit configured to selectively perform at least one of an error correction operation and a redundancy repair operation on at least one of the selected data bit and the selected parity bit based on test mode register set (TMRS) information.

2. The semiconductor memory device of claim 1, wherein each of the memory cells is a volatile memory.

3. The semiconductor memory device of claim 1, wherein the memory cells are configured to store one of the selected data bit and the selected parity bit.

4. The semiconductor memory device of claim 1, wherein the test circuit comprises:
    an error detector configured to detect at least one error of at least one of the selected data bit and the selected parity bit; and
    a test ECC circuit configured to perform the at least one of the error correction operation and the redundancy repair operation if a number of errors of the at least one of the selected data bit and the selected parity bit is less than a desired value.

5. The semiconductor memory device of claim 4, wherein the error detector is configured to detect the number of errors by ignoring the at least one of the selected data bit and the selected parity bit if the at least one of the selected data bit and the selected parity bit have a selected value based on the TMRS information.

6. The semiconductor memory device of claim 5, wherein the TMRS information comprises data ignore information indicating the selected value.

7. The semiconductor memory device of claim 5, wherein the test circuit comprises:
a comparator configured to determine a result value based on one of a corrected data bit and a corrected parity bit.

8. The semiconductor memory device of claim 4, wherein the error detector comprises:
a first XNOR operator configured to detect an error of the selected data bit by performing an XNOR operation on the selected data bit and a test data bit; and
a second XNOR operator configured to detect an error of the selected parity bit by performing an XNOR operation on the selected parity bit and a test parity bit.

9. The semiconductor memory device of claim 4, wherein the test ECC circuit comprises:
an error counter configured to count the number of errors of at least one of the selected data bit and the selected parity bit; and
an error corrector configured to correct the at least one of the selected data bit and the selected parity bit if the number of errors is less than the desired value.

10. The semiconductor memory device of claim 9, wherein the error counter comprises:
a plurality of counter circuits connected in a cascading fashion, and the plurality of counter circuits configured to detect the number of errors based on the TMRS information.

11. The semiconductor memory device of claim 9, wherein the error counter comprises cascaded error counting circuits, and
wherein at least one of the error counting circuits is configured to receive output values from the error detector and output values of a previous-stage error counting circuit, the error counting circuit further configured to output an error counting value indicating whether the number of errors is less than the desired value.

12. The semiconductor memory device of claim 11, wherein the error corrector is configured to correct the at least one error of the selected data bit and the selected parity bit based on an output value of the error counter, and the error corrector configured to output at least one of a corrected data bit and a corrected parity bit.

13. The semiconductor memory device of claim 12, wherein the error corrector comprises a plurality of logic circuits,
wherein each of the logic circuits is configured to output an error correction output signal by performing an OR operation on an output value of the error detector and an error correction control signal, and wherein the error correction control signal is based on an output value of the error counter and the TMRS information.

14. The semiconductor memory device of claim 1, wherein the test circuit is configured to determine whether to correct errors based on a number of errors of at least one of the selected data bit and selected parity bit, and the test circuit is configured to adjust the number of errors based on a redundancy repair availability.

15. The semiconductor memory device of claim 1, further comprising:
an input/output buffer configured to transfer first data between the first ECC circuit and an external device and transfer second data between the test circuit and the external device.

16. A test system comprising:
at least one memory chip; and
a tester configured to test the at least one memory chip, the at least one memory chip including,
an error correction code (ECC) circuit configured to generate at least one parity bit corresponding to a data bit during a write operation and to correct an error of the data bit using the parity bit during a read operation, and
a test circuit configured to selectively perform an error correction operation and a redundancy repair operation of at least one of the data bit and the parity bit if the ECC circuit is inactivated.

17. A semiconductor memory device comprising:
a first plurality of cells configured to store read data;
a second plurality of cells configured to store parity data corresponding to the read data; and
a test circuit configured to determine a number of errors in at least one of the read data and the parity data based on test data, and the test circuit configured to correct the errors based on the number of errors, the test circuit further configured to determine the number of errors by ignoring the at least one of the read data and the parity data having a first value, the test circuit including,
an error counter configured to count the number of errors and to generate two outputs based on the counted number of errors.

18. The semiconductor memory device of claim 17, further comprising:
a first error correction code (ECC) circuit configured to generate the parity data.

19. The semiconductor memory device of claim 17, wherein the error counter is configured to generate the two outputs such that the two outputs have a same value if the number of errors is below a threshold value and if the number of errors is above the threshold value.

* * * * *